(12) United States Patent
Ha

(10) Patent No.: US 6,700,442 B2
(45) Date of Patent: Mar. 2, 2004

(54) N WAY PHASE CANCELLATION POWER AMPLIFIER

(76) Inventor: Thomas Quang Ha, 6470 Frampton Cir., Huntington Beach, CA (US) 92648

( * ) Notice: Subject to any disclaimer, the term of this patent is extended or adjusted under 35 U.S.C. 154(b) by 0 days.

(21) Appl. No.: 09/683,918

(22) Filed: Mar. 1, 2002

(65) Prior Publication Data

US 2003/0095002 A1 May 22, 2003

Related U.S. Application Data

(60) Provisional application No. 60/319,009, filed on Nov. 20, 2001.

(51) Int. Cl.[7] .............................................. H03F 3/68
(52) U.S. Cl. .................................. 330/124 R; 330/149
(58) Field of Search ........................... 330/124 R, 149, 330/151

(56) References Cited

U.S. PATENT DOCUMENTS

| | | | |
|---|---|---|---|
| 1,686,792 A | 10/1928 | Black | |
| 3,471,798 A | * 10/1969 | Seidel | 330/124 R |
| 3,922,617 A | 11/1975 | Denniston et al. | 330/149 |
| 3,993,961 A | 11/1976 | Narayanan | 330/149 |
| 4,352,072 A | * 9/1982 | Harrington | 330/124 R |
| 4,629,996 A | 12/1986 | Watanabe et al. | 330/151 |
| 4,885,551 A | 12/1989 | Myer | 330/52 |
| 5,023,565 A | 6/1991 | Lieu | 330/151 |
| 5,043,673 A | 8/1991 | Suematsu et al. | 330/149 |
| 5,155,448 A | 10/1992 | Powell | 330/151 |
| 5,304,945 A | * 4/1994 | Myer | 330/151 |
| 5,323,119 A | 6/1994 | Powell et al. | 330/151 |
| 5,412,342 A | 5/1995 | Sakamoto et al. | 330/149 |
| 5,428,314 A | * 6/1995 | Swafford et al. | 330/149 |
| 5,528,196 A | 6/1996 | Baskin et al. | 330/151 |
| 5,610,554 A | 3/1997 | Anvari | 330/52 |
| 5,644,268 A | 7/1997 | Hang | 330/151 |
| 5,789,976 A | 8/1998 | Ghannouchi et al. | 330/151 |
| 5,917,375 A | 6/1999 | Lisco et al. | 330/151 |
| 5,969,572 A | 10/1999 | Jeong et al. | 330/149 |
| 6,037,837 A | * 3/2000 | Miyaji et al. | 330/149 |
| 6,046,635 A | 4/2000 | Gentzler | 330/149 |
| 6,087,898 A | 7/2000 | Baskin | 330/151 |
| 6,111,462 A | * 8/2000 | Mucenieks et al. | 330/151 |
| 6,133,791 A | 10/2000 | Horiguchi et al. | 330/151 |
| 6,144,255 A | 11/2000 | Patel et al. | 330/151 |
| 6,166,600 A | 12/2000 | Myer | 330/151 |
| 6,166,601 A | 12/2000 | Shalom et al. | 330/151 |
| 6,208,204 B1 | 3/2001 | Suzuki et al. | 330/52 |

* cited by examiner

Primary Examiner—Khanh Van Nguyen
(74) Attorney, Agent, or Firm—Robert J. Rose; Sheldon & Mak

(57) ABSTRACT

A low distortion power amplifier, where N is greater than 1, comprising an input divider (10) for dividing a received input signal (100), and outputting a first signal (104) and a main signal (102), a carrier cancellation component (50) connected to the input divider (10) for receiving the first signal (104) and outputting a distortion signal (114), an input attenuator (22) receiving the main signal (102) and outputting an attenuated main signal (118) to an input delay device (24) yielding a delayed, attenuated main signal (118), and an N way distortion cancellation component (52) having a first input connected to the carrier cancellation component (50) for receiving the distortion signal (114) and a second input connected to the input delay device (24) for receiving the delayed, attenuated main signal (118) and an output for outputting an amplified output signal (144) having low distortion.

7 Claims, 6 Drawing Sheets

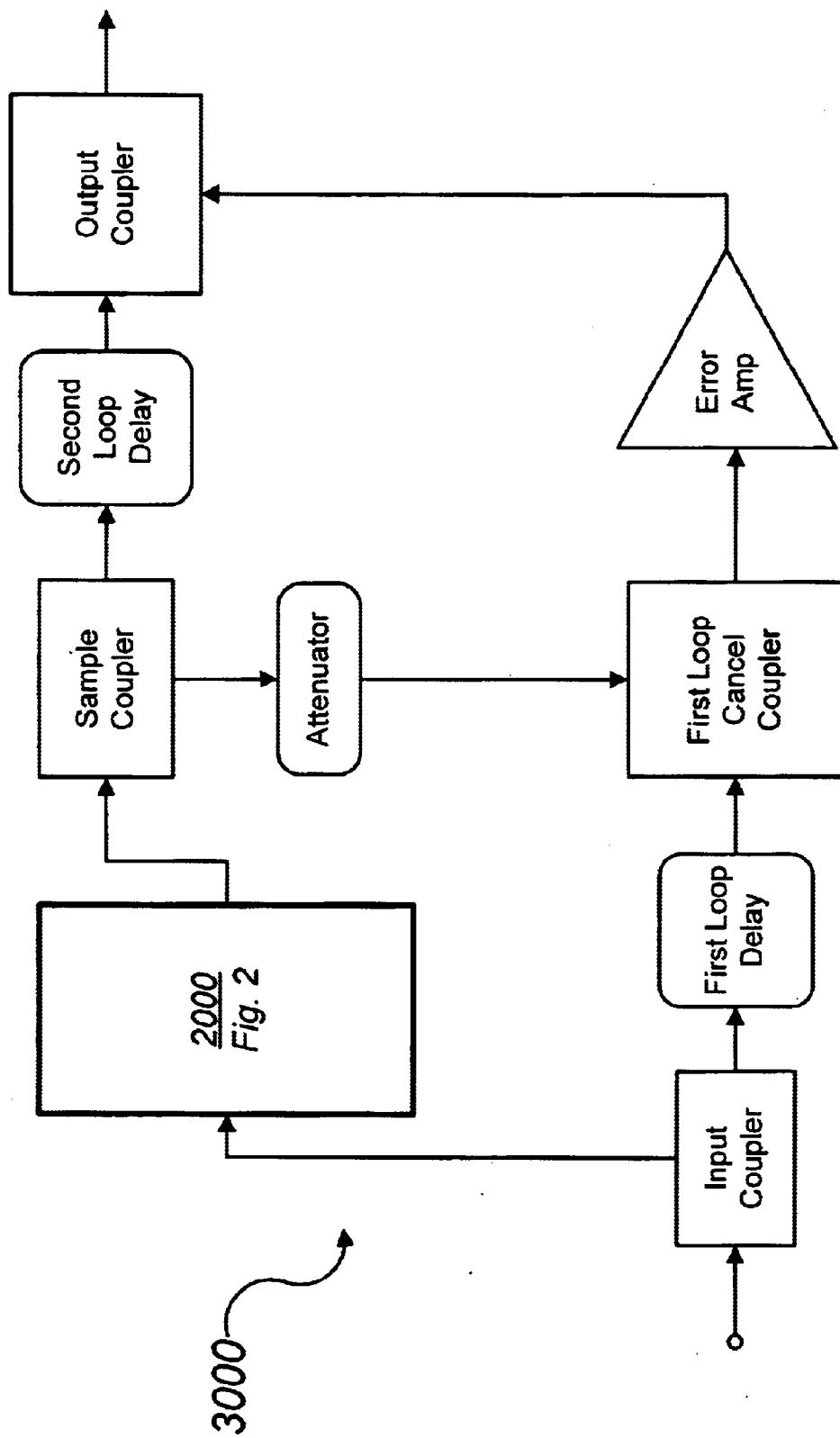

N WAY PHASE CANCELLATION POWER AMPLIFIER

CROSS REFERENCE TO RELATED APPLICATIONS

The present Application claims the benefit of U.S. Provisional Patent Application Ser. No. 60/319,009 titled "N way phase cancellation power amplifier" filed Nov. 20, 2001; the contents of which are incorporated by reference in this disclosure in their entirety.

BACKGROUND OF INVENTION

The present invention relates generally to a power amplifier, and specifically to improvements in distortion cancellation.

To provide high quality voice communication and handle more calls, telecommunication operators use digital modulation technology and multi-channel carriers. Examples of such technologies include CDMA, TDMA, w-CDMA, and EDGE-GSM. A linear RF power amplifier is needed to transmit digital/multi-carrier waveforms without adding noise, distortions, and adjacent channel interference. A typical RF power amplifier for a base station generates −30 dBc, (dB below carrier) distortion levels which does not meet the emission distortion requirement. Therefore, several linearization techniques have been used to linearize or improve the traditional class AB power amplifier inter-modulation distortion (IMD) performance.

Such linearization techniques for improving IMD include RF feedback, Cartesian feedback, analog pre-distortion, digital pre-distortion and feed forward. The RF feedback and Cartesian feedback techniques improve IMD by 10 dB but both techniques are only useful for narrowband. The feed forward technique improves IMD but at the expense of power loss and efficiency due to adding an output delay line, output couplers and the correction amplifier to the output of the main amplifier. The feed forward technique also is excessive for a CDMA system that requires only −45 dBc IMD. A pre-distortion technique becomes more attractive for such a CDMA system because it does not add the extra system at the output of the power amplifier. However, the digital pre-distortion technique is expensive because it requires very fast A/D, D/A converters and microcontrollers. The traditional analog pre-distortion improves IMD up to 8–9 dB but the gain is not stable and it is useful for only narrow band applications.

What is needed is a cost efficient power amplifier to transmit digital/multi-carrier waveforms with minimum distortion, preferably using a random phase cancellation technique.

SUMMARY OF INVENTION

The present invention meets this need by providing a cost efficient power amplifier to transmit digital/multi-carrier waveforms with minimum distortion, preferably using a random phase cancellation technique.

A low distortion power amplifier is provided, N being greater than 1, comprising an input divider having an input for receiving an input signal, a first output for outputting a first signal and a second output for outputting a main signal, a carrier cancellation component having an input connected to the input divider for receiving a first signal and an output for outputting a distortion signal, an input attenuator receiving the main signal output from the input divider and producing an attenuated main signal, an input delay device receiving the attenuated main signal from the input attenuator and outputting a delayed, attenuated main signal, and an N way distortion cancellation component having a first input connected to the carrier cancellation component for receiving the distortion signal and a second input connected to the input delay device for receiving the delayed, attenuated main signal and an output for outputting an amplified output signal having low distortion.

The carrier cancellation component for use in the low distortion power amplifier is described, comprising a pre-distortion divider having a first input connected to the input divider for receiving the first signal and an output for outputting a second signal and a third signal, a first delay device connected to the pre-distortion divider for receiving the second signal and outputting a delayed signal, a distorting device connected to the pre-distortion divider for receiving the third signal and outputting a distorted signal, and a carrier cancel combiner having a first input connected to the first delay device for receiving the delayed signal, a second input connected to the distorting device for receiving the distorted signal, and an output for outputting the distortion signal.

The N way distortion cancellation component for use in the low distortion power amplifier is described, comprising a first N way divider connected to the carrier cancellation component for receiving the distortion signal and dividing it N ways into N distortion signals, a second N way divider connected to the input delay device for receiving the delayed, attenuated main signal and dividing it N ways into N delayed, attenuated main signals, N attenuators each connected to the first N way divider for receiving one of the N distortion signals and outputting one of N attenuated distortion signals, N phase shifters each connected to one of the N attenuators for receiving one of the N attenuated, distortion signals and outputting one of N phase shifted, attenuated distortion signals, N combiners each having a first input connected to one of the N phase shifters for receiving one of the N phase shifted, attenuated distortion signals, a second input connected to the second N way divider for receiving one of the N delayed, attenuated main signals and an output for outputting one of N combination signals, N amplifiers each connected to one of the N combiners for receiving one of the N combination signals and outputting one of N amplified combination signals, and an N way combiner connected to each of the N amplifiers for receiving the N amplified combination signals and outputting the amplified output signal having low distortion.

A power amplifier using a pre-distortion technique for reducing distortion, is also provided, N being greater than 1, the power amplifier comprising an input divider having an input for receiving an input signal, a first output for outputting a main signal and a third output for outputting a first signal, a pre-distortion divider having an input for receiving the first signal, a first input for outputting a second signal and a second output for outputting a third signal, a first delay device having an input for receiving the second signal and an output for outputting a delayed signal, a distorting device having an input for receiving the third signal and an output for outputting a distorted signal, a carrier cancel combiner having a first input for receiving the distorted signal, a second input for receiving the delayed signal and an output for outputting a distortion signal, a first N way divider having an input for receiving the distortion signal and N outputs for outputting N distortion signals, an input attenuator having an input for receiving the main signal and an output for outputting an attenuated main signal, a second delay device having an input for receiving the attenuated main signal and an output for outputting a delayed, attenuated main signal, a second N way divider having an input for receiving the delayed, attenuated main signal and outputting N delayed, attenuated main signals, N attenuators each having an input for receiving one of the N distortion signals and an output for outputting one of N attenuated distortion signals, N phase shifters each having an input for receiving one of the N attenuated distortion signals and an output for outputting one of N phase shifting, attenuated distortion signals, N combiners each having a first input for receiving one of the N phase shifting, attenuated distortion signals, a second input for receiving one of the N delayed, attenuated main signals, and an output for outputting one of N combination signals, N amplifiers each having one input for receiving one of the N combination signals and an output for outputting one of N amplified combination signals, and an N way combiner having N inputs each for receiving one of the N amplified combination signals and an output for outputting an output signal.

A low distortion power amplifier using a pre-distortion technique to reduce distortion in the output is described comprising means for receiving an input signal and dividing it in to a main signal and a first signal; means for receiving the first signal and dividing it into a second signal and third signal; means for processing the second signal to produce a delayed signal; means for distorting the third signal to produce a distorted signal; means for combining the distorted signal and delayed signal to produce a distortion signal; means for attenuating the main signal to produce an attenuated main signal; means for processing the attenuated main signal to produce a delayed, attenuated main signal; means for dividing N ways the distortion signal into N distortion signals; means for dividing N ways the delayed, attenuated main signal into N delayed, attenuated main signals; means for processing each of the N distortion signals into N phase-shifted, attenuated distortion signals; means for combining each of the N phase shifted, attenuated distortion signals and the N delayed, attenuated main signals into N combination signals; means for amplifying each of the N combination signals into N amplified combination signals; and means for combining the N amplified combination signals to produce one combined output signal; wherein N is greater than 1.

Also described is a method for reducing distortion using a pre-distortion technique, in an output signal from a power amplifier, comprising the steps of receiving an input signal and dividing it into a main signal and a first signal, attenuating the main signal and outputting an attenuated main signal, processing the attenuated main signal to produce a delayed attenuated main signal, dividing the first signal into a second signal and a third signal, processing the second signal to produce a delayed signal and processing the third signal to produce a distorted signal, combining the delayed second signal and the distorted third signal to produce a distortion signal, dividing the distortion signal N ways into N distortion signals and dividing the delayed, attenuated main signal N ways into N delayed, attenuated main signals, processing each one of N distortion signals through one of N attenuators and one of N phase shifters to produce one of N phase shifted distortion signals, combining each of the N phase shifted distortion signals with one of the N delayed, attenuated main signals in one of N combiners to produce one of N combination signals, amplifying each of the N combination signals to produce N amplified combination signals, and combining each of the N amplified combination signals to produce a combined output signal, wherein N is greater than 1.

Also provided is a feed forward system comprising the described low distortion power amplifier for use as a main amplifier in a feed forward power amplifier.

BRIEF DESCRIPTION OF DRAWINGS

These and other features, aspects and advantages of the present invention will become better understood from the following description, appended claims, and accompanying drawings where:

FIG. 3 is a flow diagram of a feed forward power circuit using the power amplifier of FIG. 2 as the main amplifier in the circuit.

DETAILED DESCRIPTION

Figure 1:
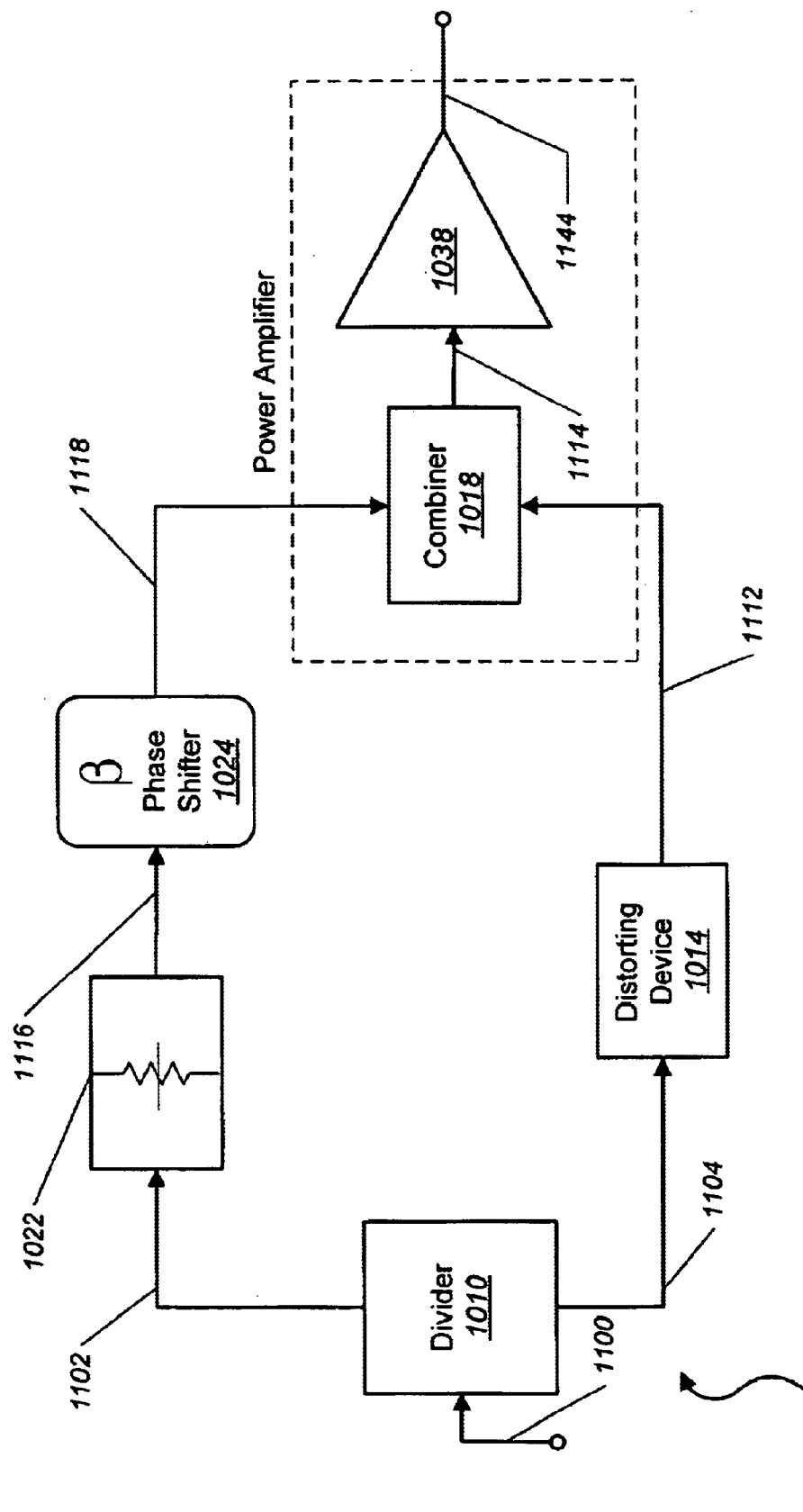
FIG. 1 is a flow diagram of a basic power amplifier using a traditional pre-distortion technique to improve distortion.

The basic power amplifier 1000 using a traditional pre-distortion technique to improve distortion performance as is well known in the art is shown in FIG. 1. An input signal 1100 is divided by an input divider 1010 into a first signal 1104 and a second signal 1102. The first signal 1104 is injected into a distorting device 1014 which then generates high distortions and outputs a distortion signal 1112. Such distorting devices may be a diode, transistor, or any other device known in the art to be useful to generate distortions. The distortion signal 1112 is then injected into the input of a combiner 1018.

The second signal 1102 output from the input divider 1010 is adjusted by an input attenuator 1022 resulting in an attenuated second signal 1116 which is then injected into an input phase shifter 1024 resulting in a phase shifted, attenuated second signal 1118. The phase shifted, attenuated signal 1118 is then combined with the distortion signal 1112 in the combiner 1018 yielding a combined signal 1114 comprising a first carrier component (not shown) and a first distortion component (not shown) out of phase with the carrier signal. The combined signal 1114 is amplified by a power amplifier 1038. At the output of the power amplifier 1038, the distortions (not shown) generated by the power amplifier 1038 are cancelled by the out of phase first distortion component in the combined signal 1114 to produce an output signal 1144.

Figure 6:
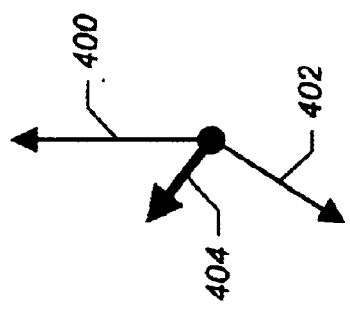
FIG. 6 is a pictorial representation of the addition of vectors representing the power and phase of the signals combined at the combiner of FIG. 1.
Figure 5:
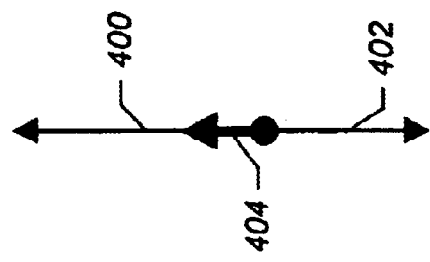
FIG. 5 is a pictorial representation of the addition of two vectors 180 degrees out of phase representing the power and phase of the signals combined at the combiner of FIG. 1.
Figure 4:
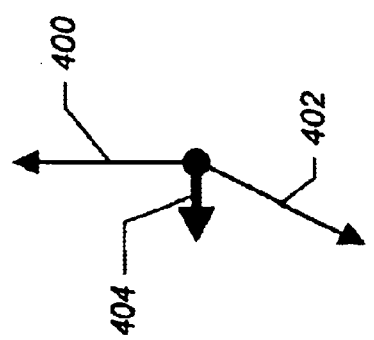
FIG. 4 is a pictorial representation of the addition of two equal amplitude vectors representing the power and phase of the signals combined at the combiner of FIG. 1.

With reference to FIG. 4, FIG. 5, and FIG. 6, the combined signal 1144 can be represented by first vector 400, and the distortion generated by the power amplifier 1038 can be represented by second vector 402, each graphically representing phase and amplitude, as is well known in the art.

FIG. 4 illustrates the case of the addition of first vector 400 and second vector 402, the vectors being of equal amplitude and approximately 180 degrees out of phase, to yield first distortion residue vector 404 which represents the amplitude and phase of a distortion residue remaining after the combined signal 1114 combines in the amplifier 1038 with the distortions generated by the power amplifier 1038.

Similarly, FIG. 5 illustrates the case of the addition of first vector 400 and second vector 402, the vectors being of approximately equal amplitude and 180 degrees out of phase, to yield first distortion residue vector 404.

Finally, FIG. 6 illustrates the case of the addition of first vector 400 and second vector 402, the vectors being of approximately equal amplitude and approximately 180 degrees out of phase, to yield first distortion residue vector 404.

In each of the three possible cases, depending upon the amplitude and phase of the vectors representing the combined signal 1114 and the distortions generated by the power amplifier 1038, it will be evident to those skilled in the art that a first distortion residue vector 404 of some amplitude and phase must be generated. It will also be evident that the closer in amplitude the vectors become, and the closer to 180 degrees they are out of phase, the smaller will be the first distortion residue vector 404. In other words, the smaller the distortion residue vector, the more the distortion will have been cancelled, leaving substantially only the first carrier component of the combined signal 1114, resulting in an output signal 1114 output from the power amplifier 1038 with minimal distortion.

The distortion cancellation technique illustrated in FIG. 1 is only for a narrow band application because at different frequencies, the first distortion component of the combined signal 1114 is no longer out of phase with the first carrier component of combined signal 1114. Also another problem is that the distortion signal 1112 and the phase shifted, attenuated second signal 1118 combined in the combiner 1018 can be out of phase and cancel each other resulting in a combined signal 1114 smaller than the input signal 1100. Therefore, this problem may cause overload or damage to the power amplifier when an input signal is out of the tuned band.

Figure 2:
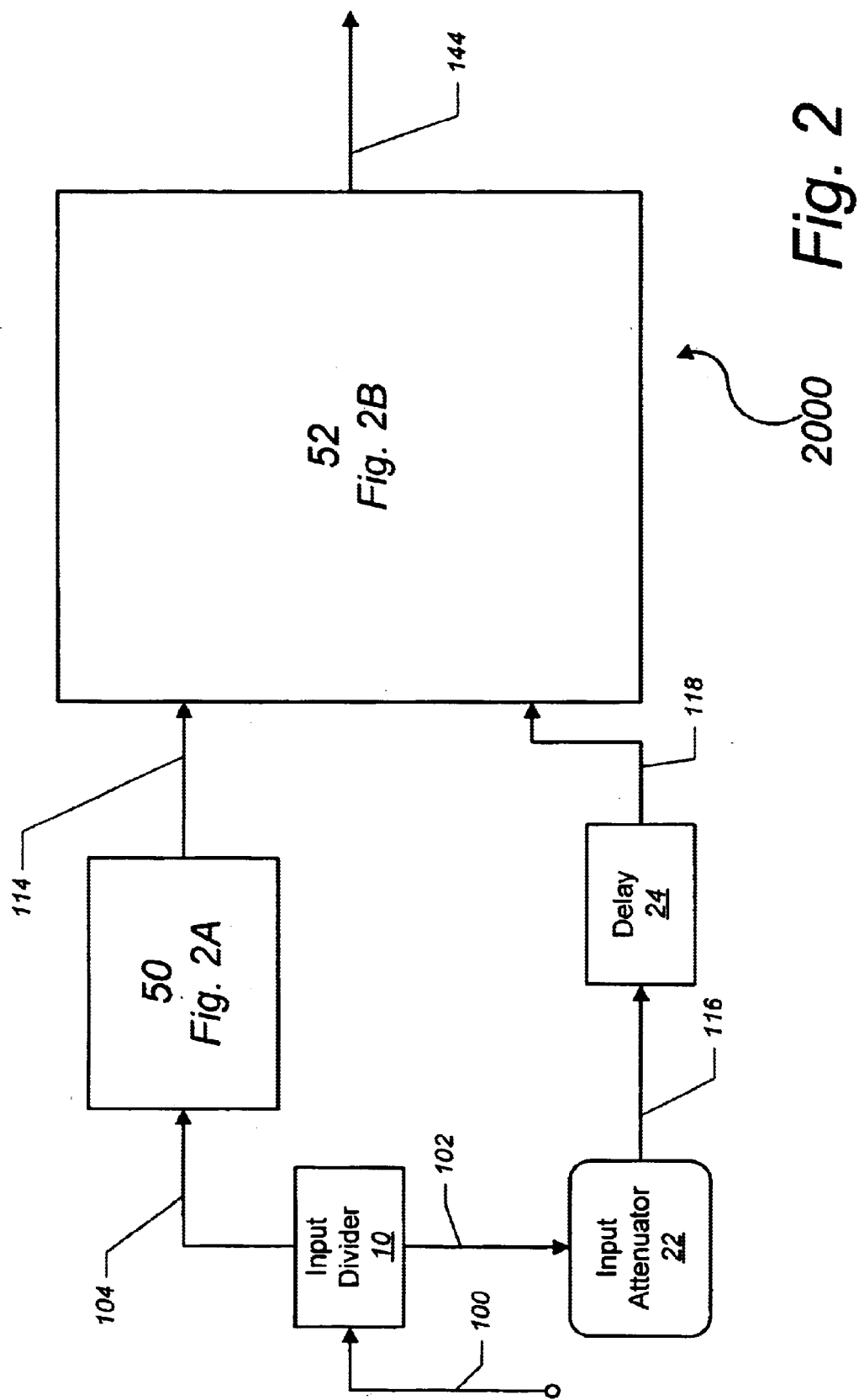
FIG. 2 is a flow diagram of a low distortion power amplifier using N way random phase cancellation to reduce distortion in the output signal.
Figure 2A:
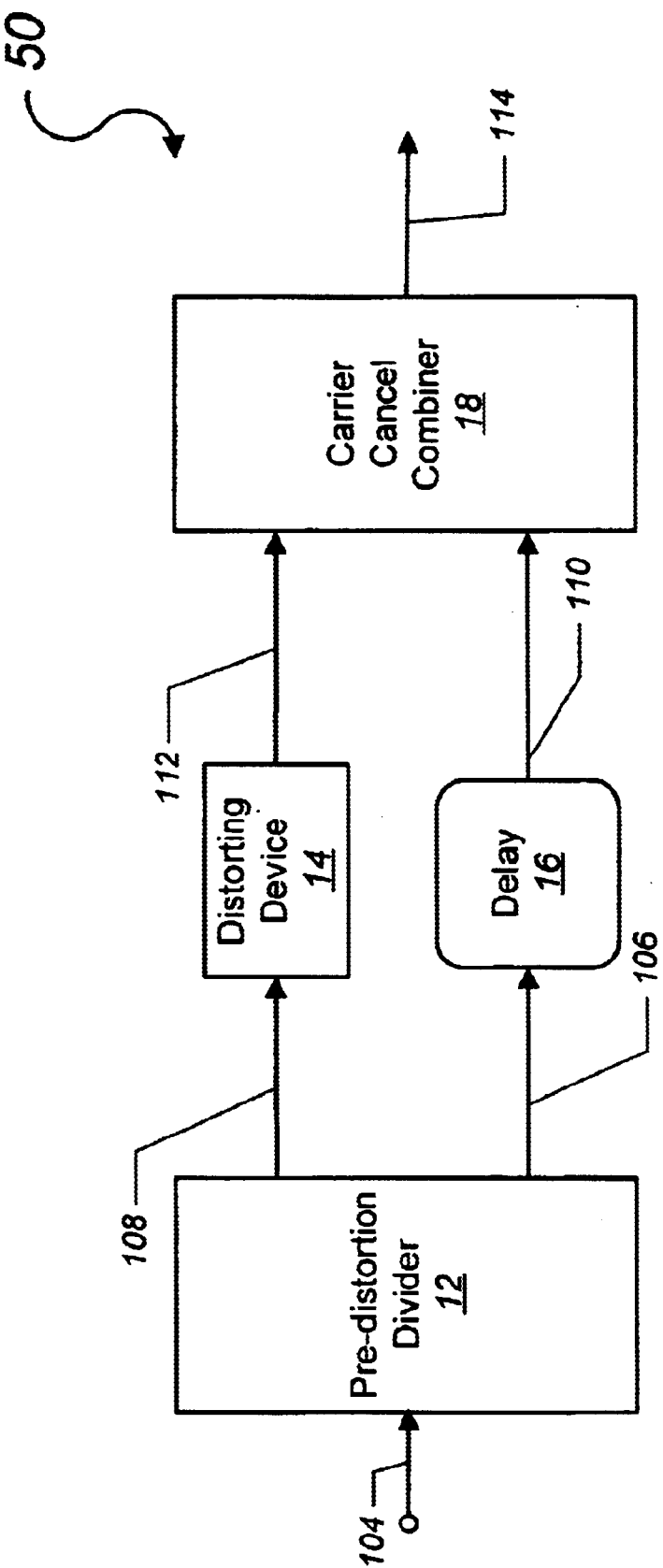
Figure 2B:
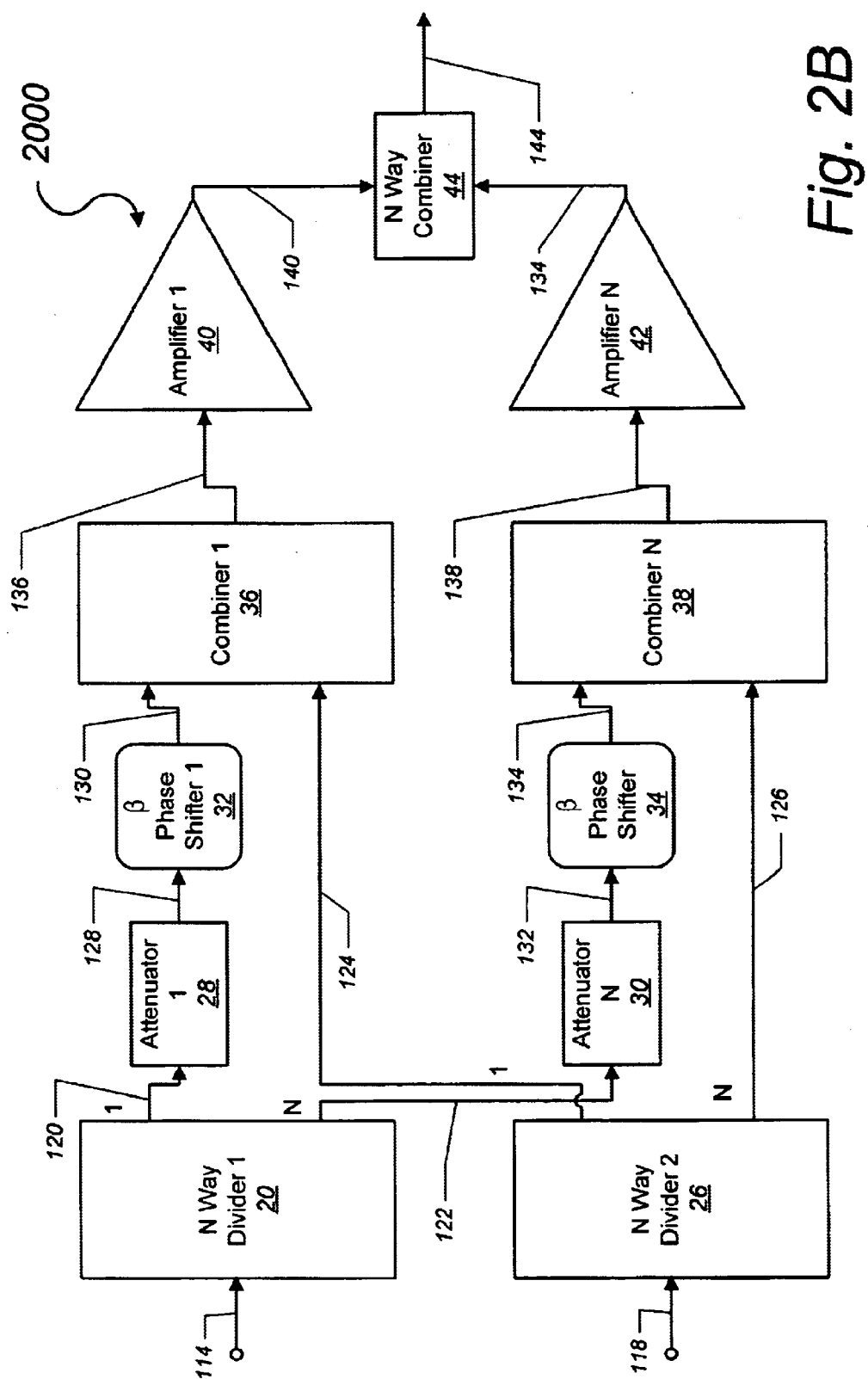

In one embodiment of the invention, the distorting device 1014 of FIG. 1 is replaced with a carrier cancellation component and the input phase shifter 1024 is replaced with an input delay device. FIG. 2 illustrates a low distortion power amplifier 2000 in which a carrier cancellation component 50 comprises a pre-distortion divider 12, a first delay device 16, a distorting device 14 and a carrier cancel combiner 18. An input divider 10 connected to the carrier cancellation component 50 receives an input signal 100 and divides the signal into a main signal 102 and a first signal 104. The pre-distortion divider 12 of the carrier cancellation component 50 receives the first signal 104 from the input divider 10 and divides it into a second signal 106 and a third signal 108. The second signal 106 is processed through first delay device 16 resulting in a delayed signal 110. The third signal 108 is injected into a distorting device 14 which then outputs a distorted signal 112 comprising a first component (not shown) having main carrier signals and a second component (not shown) having distortions. The distorted signal 112 and the delayed signal 110 are combined in the carrier cancel combiner 18 where the main carrier signals are cancelled leaving only the distortions in the resulting distortion signal 114.

The main signal 102 from the input divider 10 is processed through an input attenuator 22 resulting in an attenuated, main signal 116 which is then processed through an input delay 24 yielding a delayed, attenuated, main signal 118.

Additionally, in one embodiment of the invention, the combiner 1018 and power amplifier 1038 of FIG. 1 are replaced with an N way distortion reducing component 52 in which the reduction of distortion residue is accomplished by random phase cancellation. With reference to FIG. 2, in an additional embodiment in which N is 2, the N way distortion reducing component 52 receives the distortion signal 114 from the carrier cancel combiner 18 and the delayed, attenuated, main signal 118 processed through the input delay 24 and outputs an output signal 144 having reduced distortion.

A first N way divider 20 receives the distortion signal 114 from the carrier cancellation combiner 18 and divides it into a first distortion signal 120 and a second distortion signal 122. The second N way divider 26 receives the delayed, attenuated main signal 118 from the input delay device 24 and divides it into a first delayed, attenuated main signal 124 and a second delayed, attenuated main signal 126.

The first distortion signal 120 and the second distortion signal 122 output from the first N way divider 20 are each processed through an attenuator and phase shifter. First distortion signal 120 is processed through a first attenuator 28 yielding a first attenuated distortion signal 128 which is then processed through a first phase shifter 32 producing a first phase shifted, attenuated distortion signal 130. Second distortion signal 122 is processed through a second attenuator 30 yielding a second attenuated distortion signal 132 which is then processed through a second phase shifter 34 producing a second phase shifted, attenuated distortion signal 134.

The first phase shifted, attenuated distortion signal 130 and the first delayed, attenuated main signal 124 are combined in a first combiner 36 into a first combination signal 136 comprising a main signal component (not shown) and an out of phase distortion component (not shown). The first combination signal 136 is sent through a first amplifier 40 where the main signal component of the first combination signal 136 is amplified producing a first amplified combination signal 140. The distortion generated by the amplifier 40 is cancelled by the out of phase distortion component of the first combination signal 136 generated through the amplifier. The first amplified combination signal 140 output from the amplifier 40 comprises an amplified main signal component (not shown) and a distortion residue component (not shown).

The second phase shifted, attenuated distortion signal 134 and the second delayed, attenuated main signal 126 are combined in a second combiner 38 into a second combination signal 138 comprising a main signal component (not shown) and an out of phase distortion component (not shown). The second combination signal 138 is sent through a second amplifier 42 where the main signal component of the second combination signal 138 is amplified producing an second amplified combination signal 142. The distortion generated by the second amplifier 42 is cancelled by the out of phase distortion component of the second combination signal 138 generated through the amplifier. The second amplified combination signal 142 output from the second amplifier 42 comprises an amplified main signal component (not shown) and a distortion residue component (not shown).

The first amplified combination signal 140 and the second amplified combination signal 142 are combined in an N way combiner 44. The amplified main signal component of the first amplified combination signal 140 and the amplified main signal component of the second amplified combination signal 142 are combined in phase into an output signal 144 which is N times larger in magnitude. Since in this one embodiment N is 2, the output signal is 2 times larger. The distortion residue component of the first amplified combination signal 140 and the distortion residue component of the second amplified combination signal 142 are not in phase and are combined in random phase into a distortion residue which is N times larger in magnitude. It will be evident to those skilled in the art that the case of N equal to 2 may be generalized to any number N, greater than 2.

Since the phase and amplitude of the distortion residue components will be random, with sufficient N, when the amplified combination signals output from each amplifier are combined in the N way combiner 44 the distortion residue components will cancel one another resulting in an overall lowered distortion residue component in the output signal 144.

Figure 7:
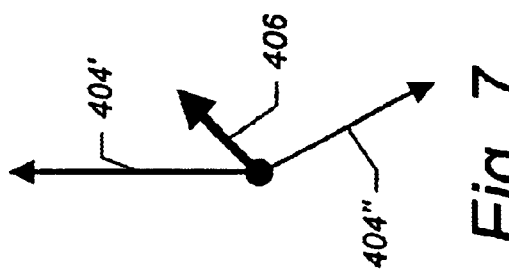
FIG. 7 is a pictorial representation of the addition of distortion residue vectors representing the power and phase of the distortion residue signals resulting from the addition of the vectors in FIG. 5.

This can be seen in FIG. 7, in which a first distortion residue vector 404' is added to a second distortion residue vector 404" yielding a third distortion residue vector 406. Since the first distortion residue vector 404' and the second distortion residue vector 404" are independent, and therefore effectively random in relation to each other, the magnitude of the resulting third distortion residue vector 406 will vary randomly between the scalar addition of the magnitudes of the first distortion residue vector 404' and the second distortion residue vector 404" (when vectors are in phase) to approaching zero (as the vectors approach equal amplitude and exactly 180 degrees out of phase).

If the signals are in phase at the output of the N way combiner 44, the resulting combined carrier power remaining after N way distortion cancellation is given by the formula in Equation 1:

$$P_{in\ phase} = (V_1 + \ldots + V_n)^2/R = N^2 V_1^2/R \quad \text{(Eq. 1)}$$

In other words, $Pi_{n\ phase}$ phase is equal to P without N way phase cancellation.

If the phases of the distortion residues are completely random at the output of the N way combiner, the resulting combined carrier power is given by the formula in Equation 2:

$$P_{random} = V_1^2/R + \ldots + V_n^2/R = NV_1^2/R \quad \text{(Eq. 2)}$$

The improvement in IMD due to random phase cancellation is given by the formula in Equation 3:

$$P_{sig}/P_{dis} = (P_{sig\ comb}/P_{each\ sig})/(P_{dis\ comb}/P_{each\ dis}) = N^2/N = N \quad \text{(Eq. 3)}$$

The improvement could be better than N by adjusting skillfully the attenuators and the phase shifters at the input of the amplifiers in such a way that the distortion residues are out of phase with each other.

Additionally, the low distortion power amplifier 2000 illustrated in FIG. 2, may serve as a main amplifier in a feed-forward system to achieve a much higher overall IMD performance. Referring to FIG. 3, the main amplifier 3000 includes the low distortion power amplifier 2000.

Having thus described the invention, it should be apparent that numerous structural modifications and adaptations may be resorted to without departing from the scope and fair meaning of the instant invention as set forth herein above and as described herein below by the claims.

What is claimed is:

1. A low distortion power amplifier comprising:
   an input divider having an input for receiving an input signal, a first output for outputting a first signal and a second output for outputting a main signal;
   a carrier cancellation component having an input connected to the input divider for receiving a first signal and an output for outputting a distortion signal;
   an input attenuator receiving the main signal output from the input divider and producing an attenuated main signal;
   an input delay device receiving the attenuated main signal from the input attenuator and outputting a delayed, attenuated main signal; and
   an N way distortion cancellation component having a first input connected to the carrier cancellation component for receiving the distortion signal and a second input connected to the input delay device for receiving the delayed, attenuated main signal and an output for outputting an amplified output signal having low distortion;
   wherein N is greater than one.

2. The low distortion power amplifier of claim 1 wherein the carrier cancellation component comprises:
   a pre-distortion divider having a first input connected to the input divider for receiving the first signal and an output for outputting a second signal and a third signal;
   a first delay device connected to the pre-distortion divider for receiving the second signal and outputting a delayed signal;
   a distorting device connected to the pre-distortion divider for receiving the third signal and outputting a distorted signal; and
   a carrier cancel combiner having a first input connected to the first delay device for receiving the delayed signal, a second input connected to the distorting device for receiving the distorted signal, and an output for outputting the distortion signal.

3. The low distortion power amplifier of claim 1 wherein the N way distortion cancellation component comprises:
   a first N way divider connected to the carrier cancellation component for receiving the distortion signal and dividing it N ways into N distortion signals;
   a second N way divider connected to the input delay device for receiving the delayed, attenuated main signal and dividing it N ways into N delayed, attenuated main signals;
   N attenuators each connected to the first N way divider for receiving one of the N distortion signals and outputting one of N attenuated distortion signals;
   N phase shifters each connected to one of the N attenuators for receiving one of the N attenuated distortion signals and outputting one of N phase shifted, attenuated distortion signals;
   N combiners each having a first input connected to one of the N phase shifters for receiving one of the N phase shifted, attenuated distortion signals, a second input connected to the second N way divider for receiving one of the N delayed, attenuated main signals and an output for outputting one of N combination signals;
   N amplifiers each connected to one of the N combiners for receiving one of the N combination signals and outputting one of N amplified combination signals; and
   an N way combiner connected to each of the N amplifiers for receiving the N amplified combination signals and outputting the amplified output signal having low distortion.

4. A power amplifier, N being greater than 1, using a pre-distortion technique for reducing distortion, the power amplifier comprising:

an input divider having an input for receiving an input signal, a first output for outputting a main signal and a second output for outputting a first signal;

a pre-distortion divider having an input for receiving the first signal, a first output for outputting a second signal and a second output for outputting a third signal;

a first delay device having an input for receiving the second signal and an output for outputting a delayed signal;

a distorting device having an input for receiving the third signal and an output for outputting a distorted signal;

a carrier cancel combiner having a first input for receiving the distorted signal, a second input for receiving the delayed signal and an output for outputting a distortion signal;

a first N way divider having an input for receiving the distortion signal and N outputs for outputting N distortion signals;

an input attenuator having an input for receiving the main signal and an output for outputting an attenuated main signal;

a second delay device having an input for receiving the attenuated main signal and an output for outputting a delayed, attenuated main signal;

a second N way divider having an input for receiving the delayed, attenuated main signal and outputting N delayed, attenuated main signals;

N attenuators each having an input for receiving one of the N distortion signals and an output for outputting one of N attenuated distortion signals;

N phase shifters each having an input for receiving one of the N attenuated distortion signals and an output for outputting one of N phase shifted, attenuated distortion signals;

N combiners each having a first input for receiving one of the N phase shifted, attenuated distortion signals, a second input for receiving one of the N delayed, attenuated main signals, and an output for outputting one of N combination signals;

N amplifiers each having one input for receiving one of the N combination signals and an output for outputting one of N amplified combination signals; and an N way combiner having N inputs each for receiving one of the N amplified combination signals and an output for outputting an output signal.

5. A low distortion power amplifier comprising:

a means for receiving, an input signal and dividing it in to a main signal and a first signal;

a means for receiving the first signal and dividing it into a second signal and a third signal;

a means for processing the second signal to produce a delayed signal;

a means for distorting the third signal to produce a distorted signal;

a means for combining the distorted signal and delayed signal to produce a distortion signal;

a means for attenuating the main signal to produce an attenuated main signal;

a means for processing the attenuated main signal to produce a delayed, attenuated main signal;

a means for dividing N ways the distortion signal into N distortion signals;

a means for dividing N ways the delayed, attenuated main signal into N delayed, attenuated main signals;

a means for processing each of the N distortion signals into N phase shifted, attenuated distortion signals;

a means for combining each of the N phase shifted, attenuated distortion signals and the N delayed, attenuated main signals into N combination signals;

a means for amplifying each of the N combination signals into N amplified combination signals; and a means for combining the N amplified combination signals to produce one combined output signal;

wherein N is greater than 1.

6. A method for reducing distortion using a pre-distortion technique, in an output signal from a power amplifier, comprising the steps of:

receiving an input signal and dividing it into a main signal and a first signal;

attenuating the main signal and outputting an attenuated main signal;

processing the attenuated main signal to produce a delayed, attenuated main signal;

dividing the first signal into a second signal and a third signal;

processing the second signal to produce a delayed signal and processing the third signal to produce a distorted signal;

combining the delayed signal and the distorted signal to produce a distortion signal;

dividing the distortion signal N ways into N distortion signals and dividing the delayed, attenuated main signal N ways into N delayed, attenuated main signals;

processing each one of N distortion signals through one of N attenuators and one of N phase shifters to produce one of N phase shifted, distortion signals;

combining each of the N phase shifted, distortion signals with one of the N delayed, attenuated main signals in one of N combiners to produce one of N combination signals;

amplifying each of the N combination signals to produce N amplified combination signals; and combining each of the N amplified combination signals to produce a combined output signal;

wherein N is greater than 1.

7. The method of claim 6 wherein the steps are used for a main amplifier in a feed forward power amplifier.

* * * * *